(12) United States Patent
Sur, Jr. et al.

(10) Patent No.: US 6,236,222 B1
(45) Date of Patent: May 22, 2001

(54) METHOD AND APPARATUS FOR DETECTING MISALIGNMENTS IN INTERCONNECT STRUCTURES

(75) Inventors: Harlan Sur, Jr., San Leandro, CA (US); Ian R. Harvey, Kaysville, UT (US)

(73) Assignee: Philips Electronics North America Corp., New York, NY (US)

( * ) Notice: Subject to any disclaimer, the term of this patent is extended or adjusted under 35 U.S.C. 154(b) by 0 days.

(21) Appl. No.: 08/974,043

(22) Filed: Nov. 19, 1997

(51) Int. Cl.[7] .................................................. G01R 31/02
(52) U.S. Cl. ............................................ 324/758; 324/751
(58) Field of Search ..................................... 324/751, 758, 324/73.1, 71.3; 382/145, 151, 294, 149; 348/126

(56) References Cited

U.S. PATENT DOCUMENTS

| | | | |
|---|---|---|---|
| 4,791,586 | * 12/1988 | Maeda et al. | 382/151 |
| 5,054,097 | * 10/1991 | Flinois et al. | 382/294 |
| 5,401,972 | * 3/1995 | Talbot et al. | 250/491.1 |
| 5,602,489 | * 2/1997 | El-Kareh et al. | 324/751 |
| 5,692,070 | * 11/1997 | Kobayashi | 382/146 |
| 5,969,357 | * 10/1999 | Todokoro et al. | 250/310 |

* cited by examiner

Primary Examiner—Safet Metjahic
Assistant Examiner—Minh Tang
(74) Attorney, Agent, or Firm—Martine Penilla & Kim, LLP

(57) ABSTRACT

Disclosed is a method for inspecting electrical interconnections in a multi-level semiconductor device. The method includes forming an interconnect structure in the multi-level semiconductor device. The interconnect structure has a lower metallization layer that lies in a lower level and an upper metallization layer that lies in an upper level. The method includes performing a passive voltage contrast operation using a scanning electron microscope to produce an image of the upper metallization layer of the interconnect structure. The method further includes inspecting the image produced by the scanning electron microscope to determine whether a misalignment is present in the interconnect structure. Additionally, the scanning electron microscope applies a beam of electrons over a selected portion of the interconnect structure, and secondary electrons are emitted off of the upper metallization layer in response to the beam of electrons. Therefore, by examining the intensity levels of the secondary electrons, it is possible to determine whether misalignments have occurred.

21 Claims, 7 Drawing Sheets

METHOD AND APPARATUS FOR DETECTING MISALIGNMENTS IN INTERCONNECT STRUCTURES

BACKGROUND OF THE INVENTION

1. Field of the Invention

The present invention relates generally to integrated circuit (IC) devices and, more particularly, to methods and apparatus for detecting misalignments in semiconductor interconnect structures.

2. Description of the Related Art

Currently, in order to remain competitive in the IC industry, IC designers must continuously reduce the overall size and the corresponding cost of IC devices. Thus, IC device features continue to shrink. As a result of this trend toward smaller feature sizes, layer-to-layer alignment is becoming more important to the performance integrity of the IC device. That is, the ability to detect layer-to-layer misalignment is critical since even small misalignments can cause, for example, unintended open circuits between conductive layers, or short circuits between adjacent features on the same layer.

FIG. 1 is a cross section view of a semiconductor device having a plurality of conventionally fabricated layers. IC devices, such as transistors are generally formed on a silicon substrate, and then interconnected to subsequently formed metallization layers with conductive vias. As shown, a base oxide 118 (e.g., $SiO_2$) is deposited over the silicon substrate. Next, a lower patterned metallization layer 112 is deposited and patterned over the base oxide 118 to form a lower level of interconnect lines. A lower network of vias 117 is patterned in the base oxide 118 before the lower patterned metallization layer 112 is formed to provide interconnection between the substrate and the lower patterned metallization layer 112.

A dielectric layer 116 is then formed over the lower patterned metallization layer 112. An upper network of vias 114 are patterned in the dielectric 116. Then, an upper patterned metallization layer 110 is deposited and patterned over the dielectric layer 116. The upper network of vias 114 provides interconnection between the lower patterned metallization layer 112 and the upper patterned metallization layer 110. The process may then be repeated to form a plurality of patterned metallization layers, via networks, and dielectric layers as needed for a particular application.

The dielectric and patterned metallization layers are typically patterned using well known photolithography techniques. Patterning is typically accomplished by depositing a photoresist layer over the layer to be patterned, and then selectively exposing the photoresist to light through a patterned reticle. Once exposed, the photoresist is developed to form a photoresist mask that is used in etching layers that are exposed and not covered by the photoresist material.

Although the above process usually results in acceptable electrical connections between the substrate and the upper patterned metallization layer 110, sometimes a faulty connection or open circuit occurs between the substrate and the upper patterned metallization layer 110 occurs. An example of an acceptable connection between the substrate and a first upper feature 110a of the upper patterned metallization layer 110 is shown in FIG. 1. The first upper feature 110a is connected through a first upper conductive via 114a to a first lower feature 112a of the lower patterned metallization layer 112. The first lower feature 112a is connected through a first lower conductive via 117a to the substrate. Most importantly, the first upper feature 110a, the first upper conductive via 114a, the first lower feature 112a, and the first lower conductive via 117a are substantially aligned along the same first vertical axis 120. This alignment results in an acceptable electrical interconnection between the first upper feature 110a and the substrate.

In contrast, an example of a clearly unacceptable connection between the substrate and a second upper feature 110b of the upper patterned metallization layer 110 is also shown in FIG. 1. Although the second upper feature 110b is connected to a second upper conductive via 114b, the second upper conductive via 114b is not connected to a second lower feature 112b (i.e., it is floating) of the lower patterned metallization layer 112. The second lower feature 112b is connected through a second lower conductive via 117b to the substrate.

In contrast to the aligned first upper feature 114a, the second upper feature 110b and second upper conductive via 114b are aligned along a second vertical axis 122, while the second lower feature 112b and second lower conductive via 117b are aligned along a third vertical axis 124. This serious misalignment may result in an open circuit between the second upper feature 110b and the substrate.

To measure this and other less serious misalignments, conventionally, a test wafer is taken out of a fabrication line after each pair of patterned metallization layers (e.g., 110 and 112) have been deposited and patterned. The test wafer is then probed at positions on the upper patterned metallization layer (e.g., 110b) and the substrate to determine whether misalignments are present between the upper feature 110b and the substrate. Misalignment may be detected by measuring the voltage difference or resistance between the substrate and the upper feature 110b. Unfortunately, this probing may result in significant damage to the IC devices on the test wafer. As a result, the probing process may introduce significant levels of particle contamination to the test wafer. When such contamination occurs, the test wafer is most likely scrapped, and may not be reintroduced into the wafer processing line. This also has the side effect of increasing costs and thereby decreasing production yield.

Accordingly, in view of the foregoing, there is a need for a nondestructive methods of detecting layer-to-layer misalignments and an apparatus for implementing the nondestructive methods.

SUMMARY OF THE INVENTION

Broadly speaking, the present invention fills these needs by providing a technique for nondestructively testing and detecting misalignments in interconnect structures. It should be appreciated that the present invention can be implemented in numerous ways, including as a process, an apparatus, a system, a device, or a method. Several inventive embodiments of the present invention are described below.

In one embodiment, a method for inspecting electrical interconnections in a multi-level semiconductor device is disclosed. The method includes forming an interconnect structure in the multi-level semiconductor device. The interconnect structure has a lower metallization layer that lies in a lower level and an upper metallization layer that lies in an upper level. The method includes performing a passive voltage contrast operation using a scanning electron microscope to produce an image of the upper metallization layer of the interconnect structure. The method further includes inspecting the image produced by the scanning electron microscope to determine whether a misalignment is present in the interconnect structure.

In another embodiment, a semiconductor inspection apparatus for detecting misalignments in an interconnect structure is disclosed. The semiconductor inspection apparatus has a chamber having an electron column and a secondary electron detector. The apparatus further includes a stage for holding a substrate having the interconnect structure. The stage is configured to tilt the substrate, such that an electron beam that is emitted from the electron column is directed at the interconnect structure, and such that a plurality of secondary electrons are emitted off of the interconnect structure and detected by the secondary electron detector.

In yet another embodiment, a system for inspecting electrical interconnections in an interconnect structure of a multi-level semiconductor device is disclosed. The interconnect structure has a lower metallization layer that lies in a lower level and an upper metallization layer that lies in an upper level. The system includes a means for performing a passive voltage contrast operation using a scanning electron microscope to produce an image of the upper metallization layer in interconnect structure. The system further includes a means for inspecting the image produced by the scanning electron microscope to determine whether a misalignment is present in the interconnect structure.

Several advantages of the embodiments of the present invention is that a minimum amount of particle contamination is introduced onto a test wafer during testing as compared to conventional probing techniques. Specifically, the present invention enables nondestructive testing for alignments in interconnect structures. Since the testing is nondestructive, the present invention may be easily integrated into a conventional fabrication process line. For example, a wafer may be removed from the line, tested, and then re-inserted back into the line to complete any remaining fabrication processes. Therefore, when test wafers are re-inserted (i.e., not thrown out), yield is higher and fabrication costs become substantially lower as compared to conventional probing techniques. Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for methods and apparatus for detecting misalignment in interconnect structures is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
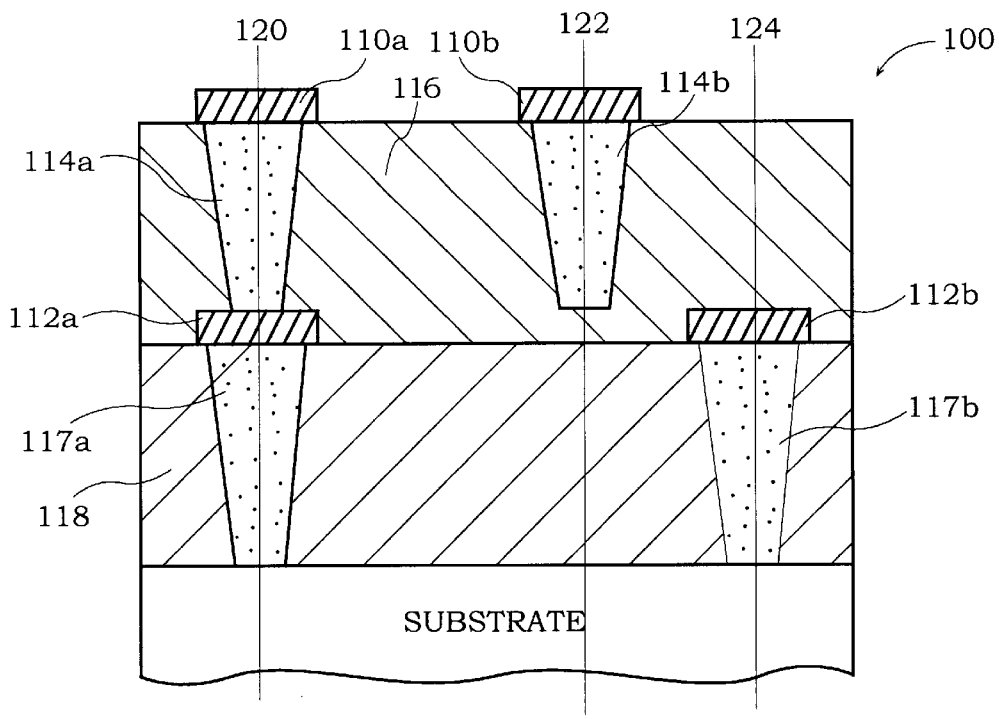
FIG. 1 is a cross section view of a semiconductor device having a plurality of conventionally fabricated layers.
Figure 2:
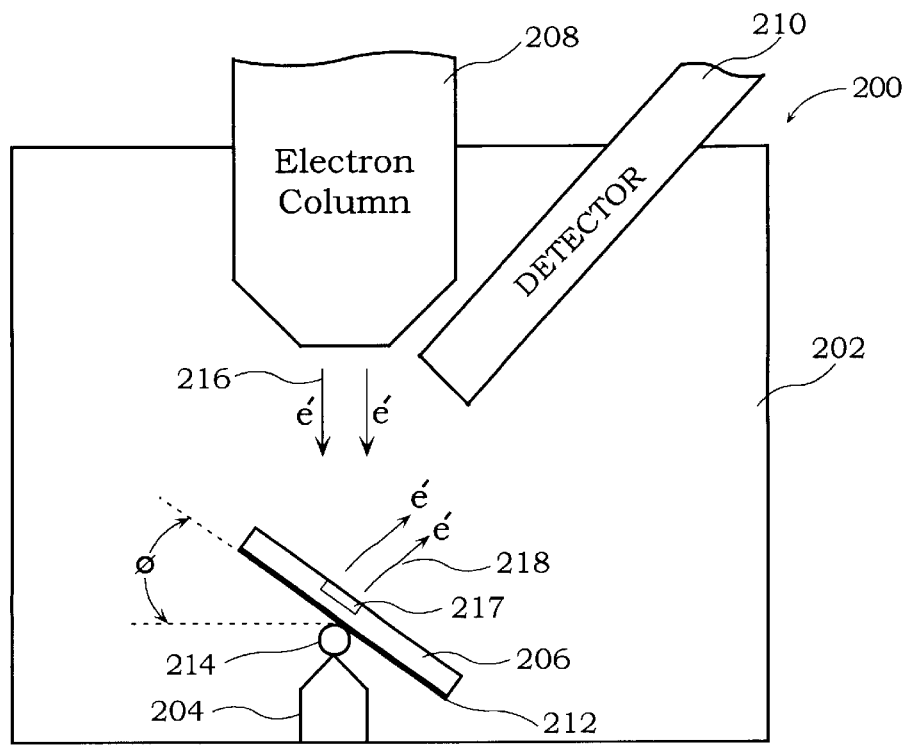
FIG. 2 is a simplified diagram of a passive voltage contrast (PVC) system that may be used for detecting misalignments in interconnect structures in accordance with one embodiment of the present invention.

FIG. 2 is a simplified diagram of a passive voltage contrast (PVC) system 200 that may be used for detecting misalignments in interconnect structures in accordance with one embodiment of the present invention. As shown, the PVC system includes a vacuum chamber 202 of a scanning electron microscope (SEM) in which a test wafer 206 is placed. Specifically, the wafer 206 rests on a stage 204 within the vacuum chamber 202. The stage 204 includes a wafer support member 212 and a pivoting mechanism 214 for adjusting the angle of the wafer support member 212.

The PVC system 200 also includes an electron column 208 and a secondary electron detector 210. After the test wafer 206 is loaded into the vacuum chamber 202, the vacuum chamber is evacuated to bring it down to a vacuum, and the SEM is turned ON. When the SEM is on, an electron beam 216 is shot through the electron column 208 and onto the test wafer 206. As a result of the electron beam 216, secondary electrons 218 are produced by the test wafer 206. The secondary electron detector 210 monitors these secondary electrons 218. Generally, the stage 204 moves a target area 217 of the test wafer 206 under the electron beam 216. Once the stage moves the target area 217, the electron beam 216 is applied to the target area 217 in a raster scan pattern. The target area 217 contains interconnect structures which produce secondary electrons 218. In this embodiment, the amount of secondary electrons 218 that are emitted from particular interconnect structures is used to ascertain whether selected ones of the particular interconnect structures are misaligned.

By way of example, when a substantial misalignment occurs in an interconnect structure (e.g., the structure is floating), less secondary electrons are emitted as compared with an interconnect structure that is substantially aligned. That is, a misaligned interconnect structure will appear darker than an aligned interconnect structure. Thus, the user may assess the degree of misalignment in an interconnect structure by comparing the relative light and dark patterns on numerous interconnect structures.

Preferably, the SEM is calibrated so that a user may optimally view misalignments. As will be explained in more detail below with reference to FIGS. 3A and 3B, the user detects misalignment in interconnect features by assessing relative patterns of lightness and brightness of particular features of the interconnect structures on the test wafer. In this embodiment, the SEM is preferably calibrated by adjusting an acceleration voltage, an angle of the test wafer, and a contrast level. The acceleration voltage is chosen so that the electrons of the electron beam 216 are shot onto the test wafer 206. The acceleration voltage is preferably set to be at most about 2 kV. As shown, the test wafer 206 is tilted by adjusting an angle θ between the wafer support member 212 and a horizontal axis.

More specifically, the test wafer is titled to an angle θ to ensure that the dark and light patterns are sufficiently defined to ascertain whether a misaligned (or floating) interconnect structure is present on the test wafer 206. Preferably, the angle θ is between about 45 degrees and about 85 degrees, and more preferably, between about 55 degrees and about 75 degrees, and most preferably about 65 degrees. Further, the contrast level is preferably adjusted to optimize the detection of patterns of light and dark regions, which regions signify whether a misalignment is present in the interconnect structure.

It should be understood that any conventional SEM system may be used, so long as the above described calibrations, or their equivalent are performed. For example, a JEOL SEM System, model number JWS 7515, SEM of Tokyo, Japan may be used. In one embodiment, the SEM system of the present invention may be coupled to a computer system, which may include a user interface to allow a user to input calibrations, record images (i.e., via print-outs or computer files), move the stage 204, and create or run programs to automatically perform interconnect misalignment testing.

The PVC system 200 may be setup as part of a semiconductor fabrication line in which wafer lots are processed. In one embodiment, the PVC system 200 is preferably used to test wafers from selected wafer lots after a particular interconnect structure is completed. As will be described below, an interconnect structure may include a bottom conductive metallization layer that is interconnected with a conductive via to an upper conductive metallization layer. Thus, in multi-level metallization structures, there may be more than one interconnect level to be tested by the PVC system 200.

One advantage of the PVC system 200 is that it introduces minimal amounts of particle contamination onto the test wafer 206 compared to conventional probing techniques. Thus, it should be appreciated that the PVC system 200 is a very clean testing technique that will not damage a wafer when it is tested to detect misalignment in interconnect structures. As such, the wafer may be re-introduced into the process line after it is tested.

Figure 3A:
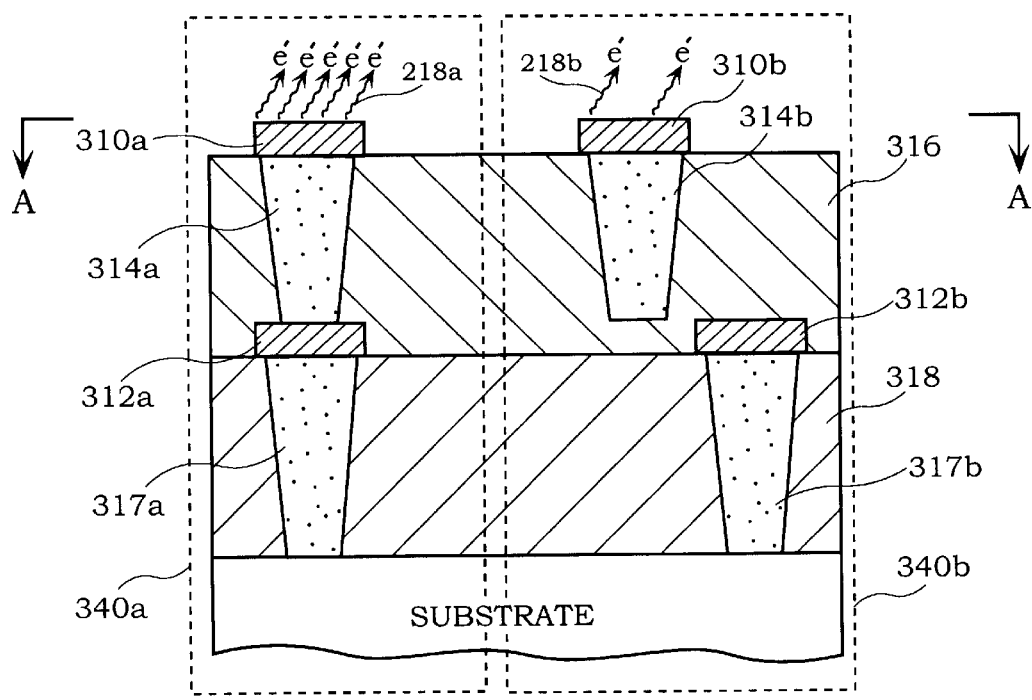
FIG. 3A is a cross section view of interconnect structures that are undergoing testing in the PVC system of FIG. 2 in accordance with one embodiment of the present invention.

FIG. 3A is a cross section view of interconnect structures 340a and 340b that are undergoing testing in the PVC system of FIG. 2 in accordance with one embodiment of the present invention. As shown, a substrate is provided. Although not shown here for clarity purposes, the substrate typically includes integrated circuits, such as transistor devices. In this example, a lower insulating layer 318 (e.g., $SiO_2$) is deposited over the silicon substrate. A lower network of conductive vias 317 (e.g., tungsten filled or aluminum filled conductive vias) is patterned in the lower insulating layer 318. Next, a lower patterned metallization layer 312 is deposited and patterned over the lower insulating layer 318 to form a lower level of interconnect lines. The network of lower conductive vias 317 provide electrical interconnection between the lower patterned metallization layer 312 and the substrate which may include transistor devices.

An upper insulating layer 316 is then formed over the lower patterned metallization layer 312. An upper network of conductive vias 314 are patterned in the upper insulating layer 316. Then, an upper patterned metallization layer 310 is deposited and patterned over the upper insulating layer 316. The upper network of conductive vias 314 is used to provide interconnection between the lower patterned metallization layer 312 and the upper patterned metallization layer 310. The process may then be repeated to form additional patterned metallization layers, via networks, and insulating layers as needed for a particular application.

As shown, one interconnect structure 340a includes an upper conductive feature 310a of the upper patterned metallization layer 310 that is electrically connected to a substrate through an upper via 314a, a lower conductive feature 312a of the lower patterned metallization layer 312, and a lower via 317a. In contrast, interconnect structure 340b is not connected to the substrate. In this example, a misalignment has occurred and therefore results in a floating structure that does not connect to the substrate. Specifically, a gap is present between an upper via 314b and a lower conductive feature 312b.

During the aforementioned PVC test (as illustrated in FIG. 2), the electrons in the electron beam 216 are directed at the interconnect structures (e.g., 340a and 340b). When the interconnect structures 340a and 340b are bombarded with the electrons of the electron beam 216, secondary electrons (e.g., 218a and 218b) are produced by the interconnect structure (e.g., 340a and 340b), and are detected by the secondary electron detector 210. In this example, the amount of secondary electrons 218a from the interconnect structure 340a will likely be substantially greater than the amount of secondary electrons 218b from the interconnect structure 340b that has a gap. As mentioned above, the user may detect this difference in the amount of secondary electrons by comparing the relative brightness of the interconnect structures 340a and 340b. That is, the upper conductive feature 310a of the interconnect structure 340a will appear brighter than the upper conductive feature 310b of the interconnect structure 340b that has a gap.

Figure 3B:
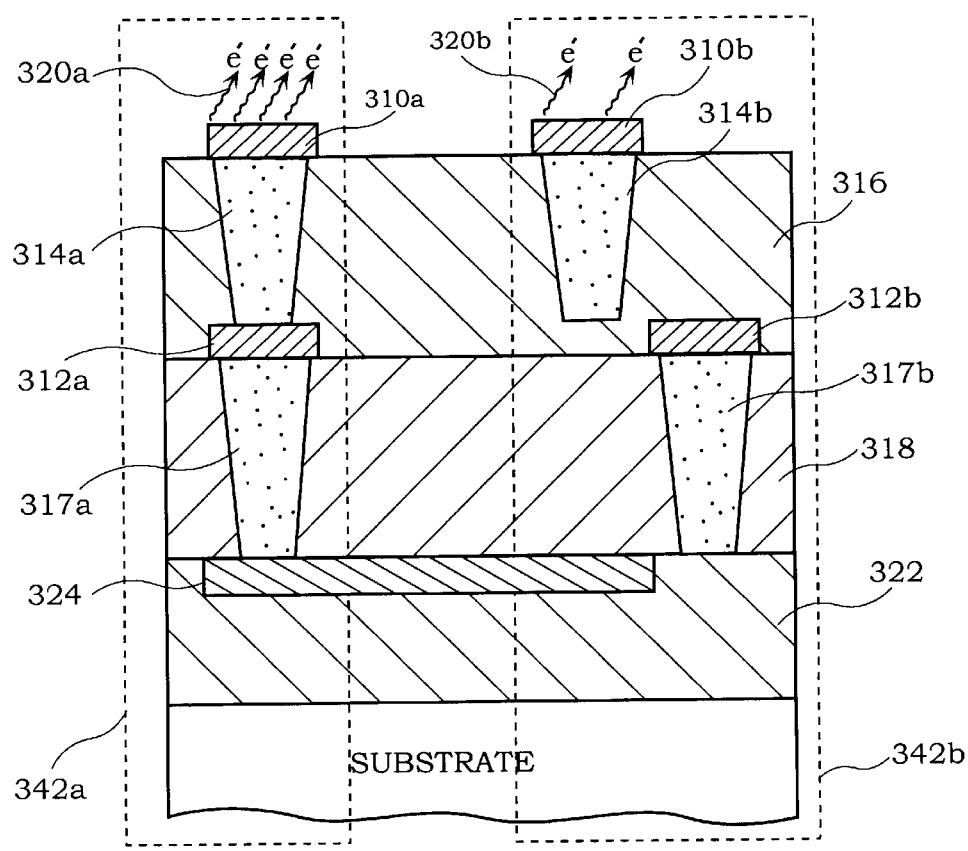
FIG. 3B is a cross section view of interconnect structures that are undergoing testing in the PVC system of FIG. 2 in accordance with an alternative embodiment of the present invention.

FIG. 3B is a cross section view of interconnect structures 342a and 342b that are undergoing testing in the PVC system of FIG. 2 in accordance with an alternative embodiment of the present invention. Like the interconnect structure 340a of FIG. 3A, the interconnect structure 342a of FIG. 3B has an upper conductive feature 310a, an upper conductive via 314a, a lower conductive feature 312a, and a lower conductive via 317a. In contrast to the interconnect structure 340a of FIG. 3A, however, the interconnect structure 342a of FIG. 3B is not electrically connected to a substrate, but is instead electrically connected to a conductive base feature 324 of a patterned metallization layer.

As is the case for interconnect structure 342a, the interconnect structure 342b is supposed to be connected to the conductive base feature 324, however, the interconnect structure 342b is not connected to conductive base feature 324. In this example, misalignments have occurred, and a gap is present between a lower conductive via 317b and the conductive base feature 324. Further, a gap is also present between an upper conductive via 314b and a lower conductive feature 312b.

In this embodiment, during the aforementioned PVC test, the interconnect structures 342a and 342b produce secondary electrons (e.g., 320a and 320b) in a similar manner as the interconnect structures 340a and 340b of FIG. 3A. However, the interconnect structure 342a produces less secondary electrons 320a than the interconnect structure 340a of FIG. 3A, even though interconnect structures 340a and 342a are both similarly aligned. This is because the substrate generally has a larger area than the conductive base structure 324. The interconnect structure 342b that is misaligned produces even fewer secondary electrons 320b than the interconnect structure 342a that is substantially aligned.

As explained with reference to FIG. 3A, the higher intensity of secondary electrons 320a that emanate from the interconnect structure 342a results in a brighter appearance in interconnect structure 342a, and the lower intensity of secondary electrons 320b that emanate from the interconnect structure 342b results in a darker appearance in interconnect structure 342b. Thus, the user may use this difference in appearance to detect misalignments in interconnect structures, such as the example structures of FIG. 3B and FIG. 3A.

Figure 4A:
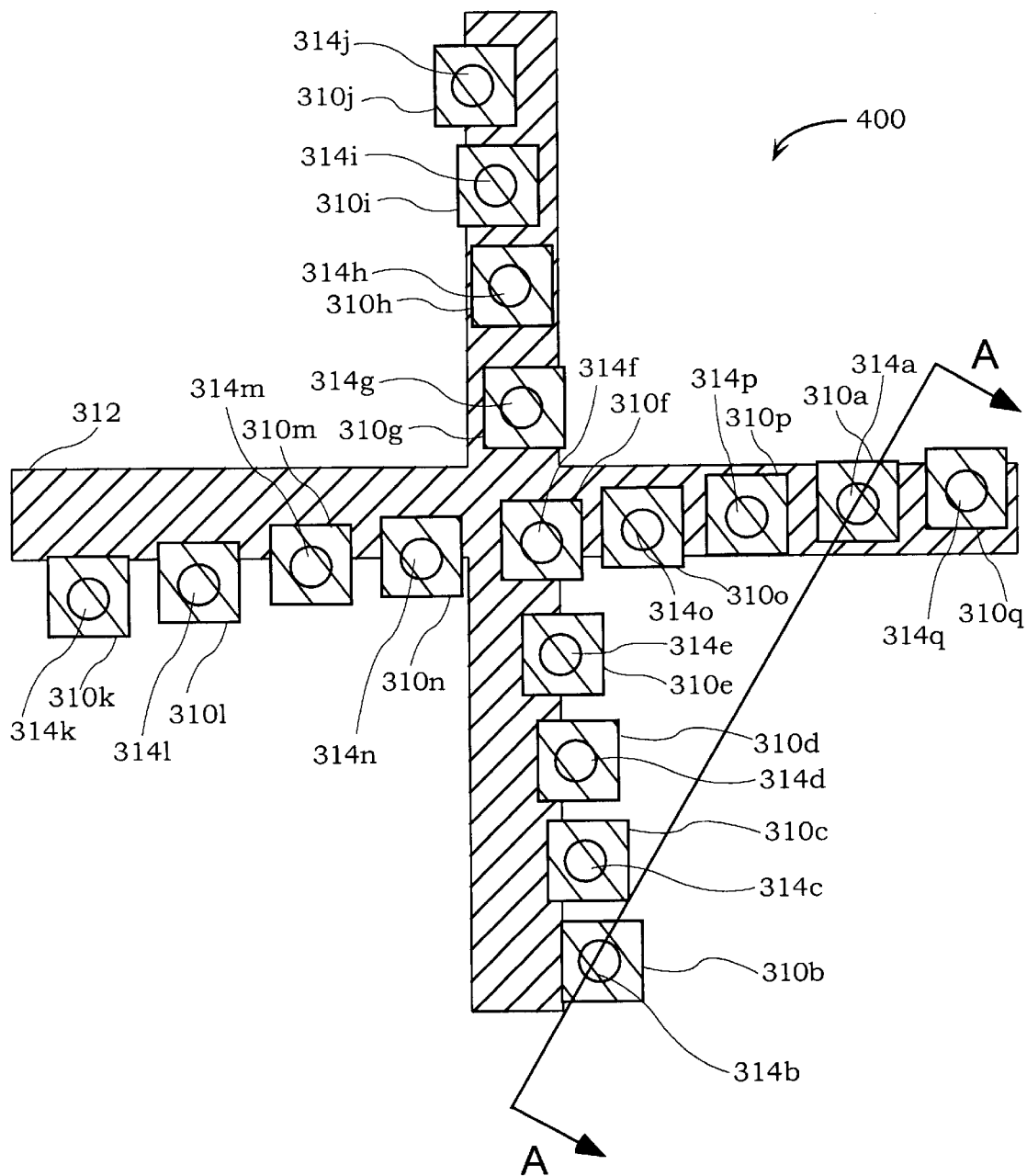
FIG. 4A is a simplified top view of a test structure in accordance with one embodiment of the present invention.

FIG. 4A is a simplified top view of a test structure 400 in accordance with one embodiment of the present invention. The test structure 400 may be used to detect misalignments between the upper conductive features 310 of an upper patterned metallization layer, and a lower conductive feature 312 of a lower patterned metallization layer. As shown, each of the upper conductive features 310 (e.g., 310a through 310q) are positioned over an associated upper conductive via 314 (e.g., 314a through 314q, respectively). For example, upper conductive feature 310a is positioned over upper conductive via 314a. Further, the lower conductive feature 312 is in the shape of a cross (i.e., a "+"), and lies below the upper conductive features 310 and upper conductive vias 314.

Ideally, the upper conductive features 310 are aligned directly over each arm of the lower conductive feature 312 cross "+". However, as shown, the upper conductive features 310 are misaligned from this ideal arrangement. For example, upper conductive feature 310b is seriously misaligned from the lower conductive feature 312. In other words, no portion of the upper conductive feature 310b overlies the lower conductive feature 312. In contrast, the upper conductive feature 310a is almost entirely over an arm of the lower conductive feature 312.

Reference is now drawn to a cross section A—A of FIG. 4A. For ease of reference, the test structure 400 has a cross section A—A that illustrates the relative alignments of conductive features 310a and 310b. In this example, the upper conductive feature 310a is shown to be aligned with the underlying cross "+" of the lower conductive feature 312, while the upper conductive feature 310b is shown to be completely misaligned. FIG. 3A illustrates the cross section A—A of FIG. 4A.

Figure 4B:
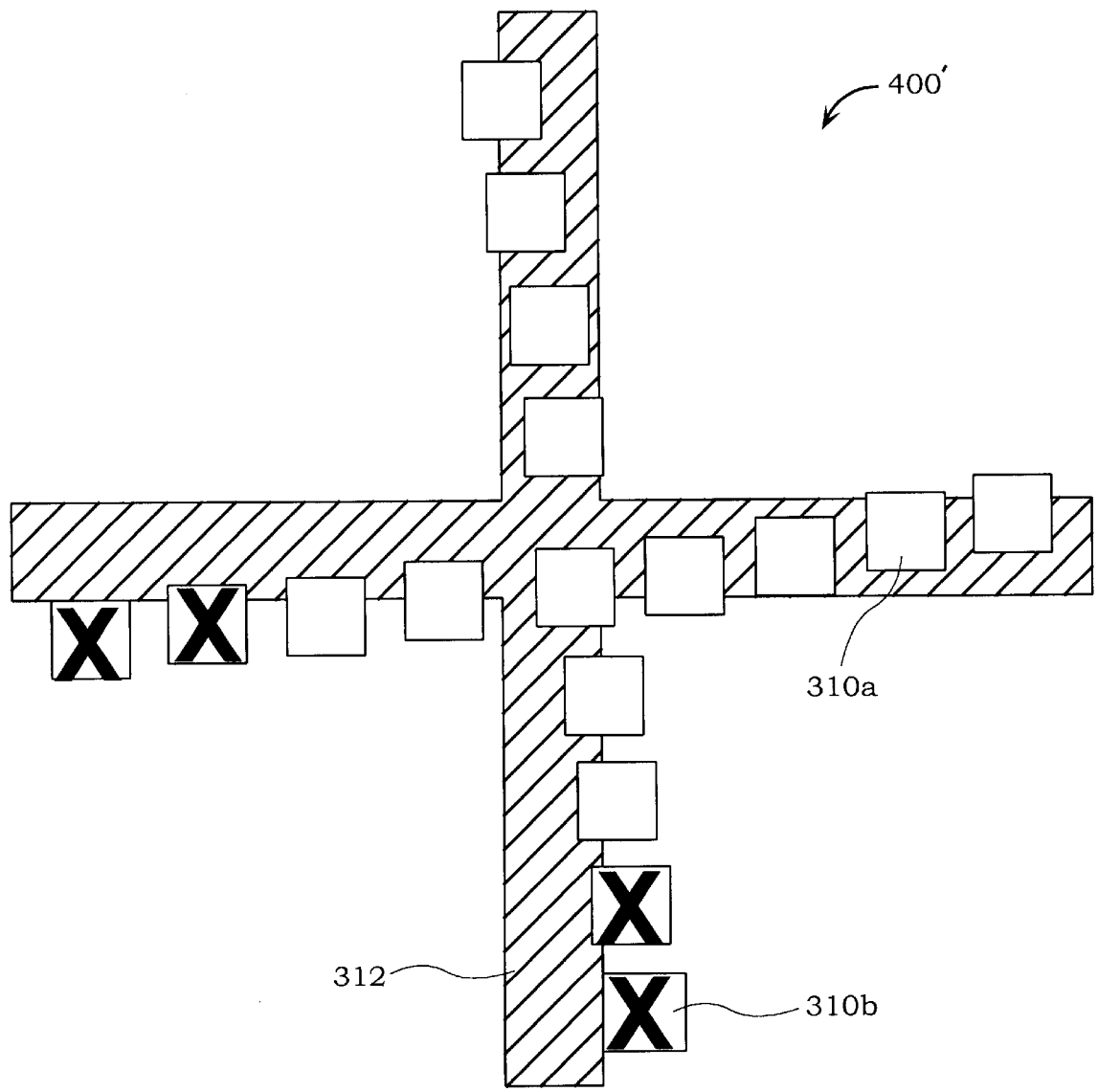
FIG. 4B is a simplified top view of a test structure in accordance with an alternative embodiment of the present invention.

FIG. 4B is a simplified top view of a test structure 400' in accordance with an alternative embodiment of the present invention. As mentioned above, when the test structure 400' is undergoing the PVC test and when particular interconnect structures are seriously misaligned, the misaligned interconnect structures will appear darker (e.g., due to fewer emanating secondary electrons). In contrast, other interconnect structures that are not substantially misaligned will appear lighter (e.g., due to more emanating secondary electrons).

In FIG. 4B, the upper conductive features 310 that are seriously misaligned have a large "X". This large "X" represents an upper conductive feature that would appear darker in the PVC system 200. For example, the upper conductive feature 310b that is misaligned has an "X", and would appear darker. By way of another example, the upper conductive feature 310a that is substantially aligned does not have an "X", and would appear lighter.

Figure 5A:
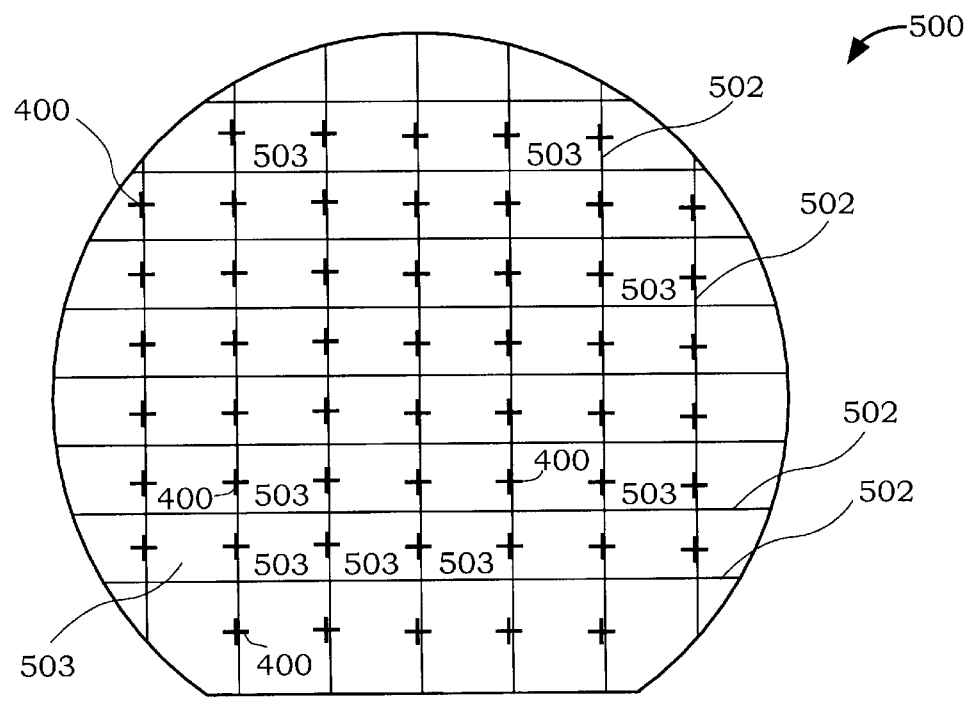
FIG. 5A is a simplified top view of a test wafer that includes a plurality of test structures of FIG. 4A in accordance with one embodiment of the present invention.

FIG. 5A is a simplified top view of a test wafer 500 that includes a plurality of test structures 400 of FIG. 4A in accordance with one embodiment of the present invention. The test structures 400 may be arranged in any number of ways on a test wafer. For example, each test structure 400 may be placed along a scribe line 502 of a die 503 as represented in FIG. 5A. Advantageously, the arrangement of the test structures 400 in this embodiment utilizes the normally wasted die space of the scribe line 502. Additionally, this arrangement ensures that misalignments that occur in only one area of the test wafer 500 are detected, since each usable die has an associated test structure.

Figure 5B:
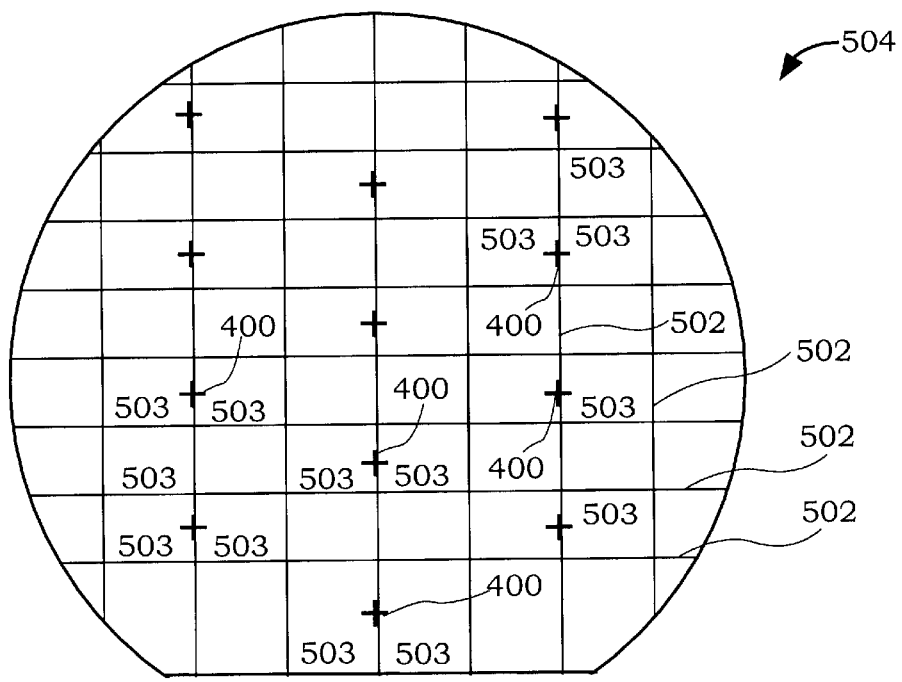
FIG. 5B is a simplified top view of a test wafer that includes a plurality of test structures of FIG. 4A in accordance with an alternative embodiment of the present invention.

FIG. 5B is a simplified top view of a test wafer 504 that includes a plurality of test structures 400 of FIG. 4A in accordance with an alternative embodiment of the present invention. In this embodiment, the test structures 400 are also arranged along side the scribe lines 502, but alternate along side every four usable dies 506. Although the test structure 400 arrangement of FIG. 5B is not as densely packed with test structures 400 as the arrangement of FIG. 5A, the test structure 400 arrangement of FIG. 5B reasonably ensures that most misalignments will be detected, while decreasing the time required for testing each wafer. Of course, more or less test structures 400 may be incorporated into a particular design depending on the criticality of misalignment testing.

Figure 6A:
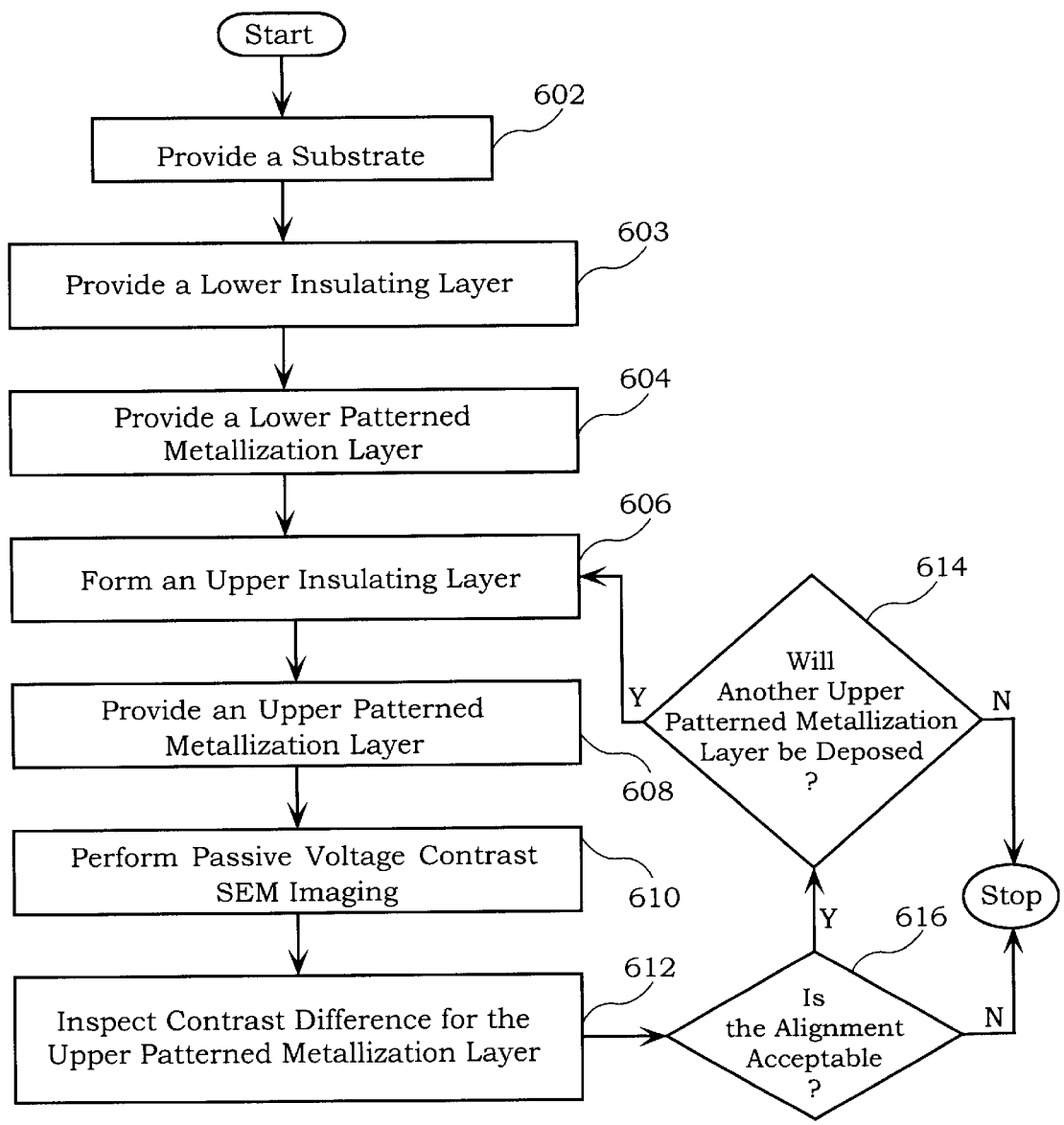
FIG. 6A is a flowchart illustrating a process for detecting misalignments in interconnect structures in accordance with one embodiment of the present invention.

FIG. 6A is a flowchart illustrating a process 600 for detecting misalignments in interconnect structures in accordance with one embodiment of the present invention. In general, a first layer of interconnect structures is provided by conventional fabrication techniques. Of course, there are numerous ways to fabricate interconnect structures, only two of which are illustrated in FIGS. 3A and 3B. Initially, a substrate is provided in operation 602. In operation 603, a lower insulating layer with lower conductive vias is provided. Next, in an operation 604, a lower patterned metallization layer is provided. In an operation 606, an upper insulating layer with upper conductive vias is provided. In operation 608, an upper patterned metallization layer completes a first layer of interconnect structures.

After the first layer of interconnect structures are provided, the method proceeds to an operation 610 where a PVC test is performed on the interconnect structures, and as a result, SEM imaging is provided. These SEM images may then be viewed by a user, saved as a computer image file, or printed in the form of a photograph. After the SEM image is provided in operation 612, contrast differences on the upper patterned metallization layer are inspected to ascertain alignment.

The method then proceeds to a determination operation 616, where it is determined whether the tested alignment is within acceptable limits. For example, a interconnect structure that is totally disconnected from the substrate is clearly unacceptable, while an interconnect structure that is perfectly aligned from the upper patterned metallization layer to the substrate is clearly acceptable. On the other hand, an alignment that is somewhere between these two extreme cases (e.g., not a clearly unacceptable or clearly acceptable case) will have to be assessed more rigorously to determine whether specification requirements are met.

If the alignment is unacceptable, the wafer process may be stopped for all wafers that contain the unacceptable misalignment. However, if the alignment is acceptable, the method will proceed to a decision operation 614 where a determination is made as to whether another upper patterned metallization layer is to be formed. When another upper patterned metallization layer is to be formed, this means that another layer of interconnect structures will fabricated.

Thus, another interconnect structure having an upper and lower patterned metallization layer is formed by repeating operations 606 and 608. In other words, the formerly upper patterned metallization layer now becomes a lower patterned metallization, and a new upper patterned metallization layer is fabricated. The above operations 606 through 614 are repeated for each subsequently fabricated layer of the interconnect structures.

Figure 6B:
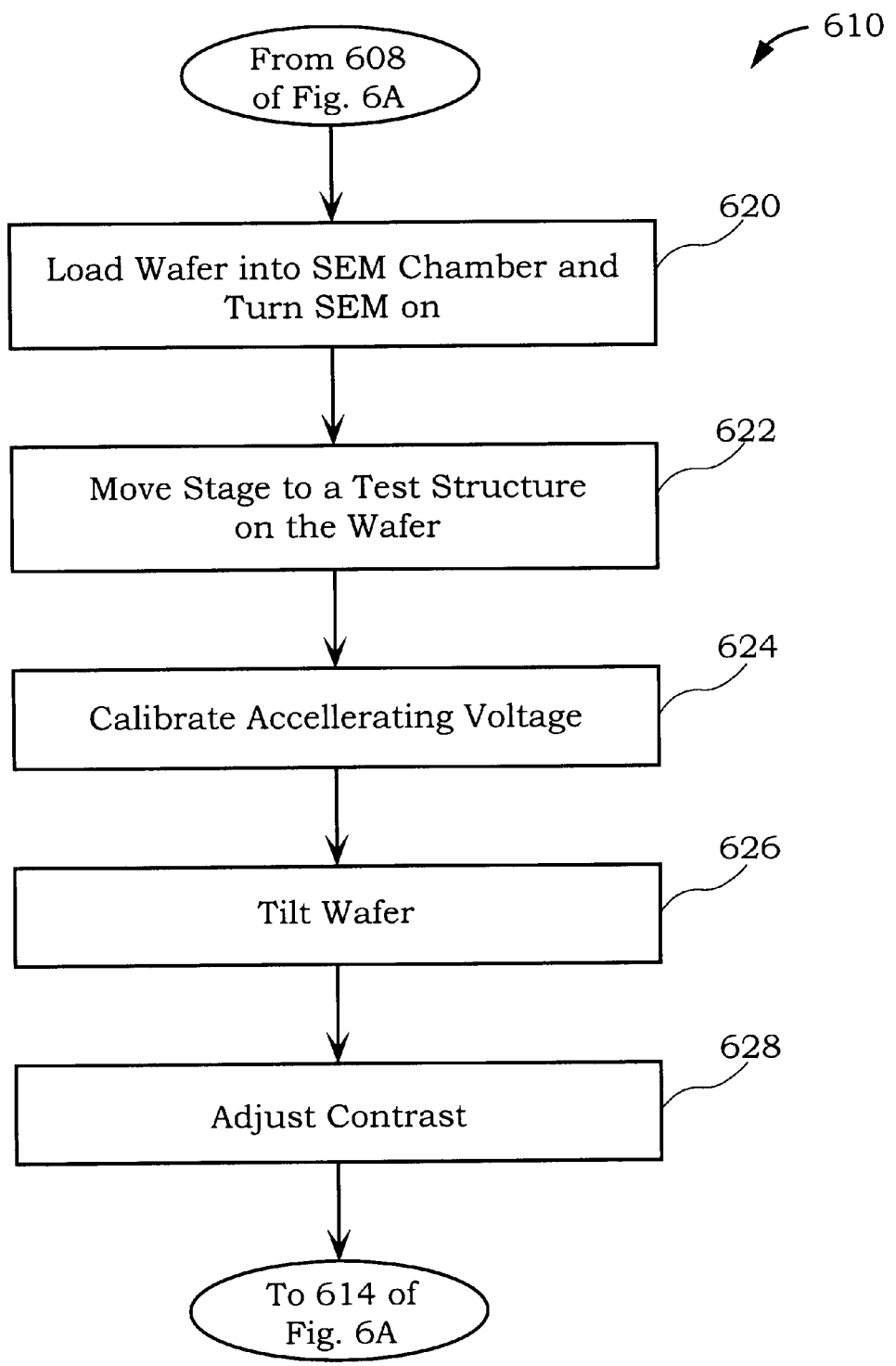
FIG. 6B is a more detailed flowchart illustrating the operation of performing the PVC test of FIG. 6A in accordance with one embodiment of the present invention.

FIG. 6B is a more detailed flowchart illustrating the operation 610 of performing the PVC test of FIG. 6A in accordance with one embodiment of the present invention. After a layer of interconnect structures is formed in operations 602 through 608, the PVC test is performed in operation 610. The following operations represent a preferred order and, of course, the operations may be arranged in any suitable order that allows detection of alignment in interconnect structures.

As mentioned above with reference to FIG. 2, in an operation 620 a wafer is loaded into the SEM vacuum chamber 202 of the PVC system 200. When the wafer is loaded, the SEM is turned ON. More specifically, the test wafer 206 is loaded onto the stage 204 in the vacuum chamber 202. In an operation 622, the stage is then moved so that a particular test structure 400 on the wafer is positioned directly below the electron beam 216. In operations 624, 626, and 628, the SEM is calibrated to allow optimal detection of alignment in interconnect structures on the test structure 400. In operation 624, the acceleration voltage is chosen (i.e., 2 kV), in operation 626 the angle of the stage is chosen (i.e., 65 degrees), and in operation 628 a contrast level is chosen.

As explained above, these operations for detecting alignment in interconnect structures represent a nondestructive testing procedure, and are a significant improvement over conventional probing techniques. For instance, the above operations may be easily integrated into a conventional fabrication process line. That is, a wafer may be removed from the line, tested, and then re-inserted back into the line to complete any remaining fabrication operations. Additionally, since the test wafer is not wasted, yield is higher and fabrication costs are significantly lower for the present invention as compared to commonly used conventional probing techniques.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for inspecting electrical interconnections in a semiconductor device, comprising the acts of:
   forming an interconnect structure in the semiconductor device, the interconnect structure having a lower metallization layer that lies in a lower level, and an upper metallization layer that lies in an upper level;
   performing a passive voltage contrast operation using a scanning electron microscope to produce an electron intensity image that is defined from the upper metallization layer of the interconnect structure; and
   inspecting the electron intensity image produced by the scanning electron microscope to determine whether a misalignment between the upper metallization layer and the lower metallization layer is present in the interconnect structure.

2. A method for inspecting electrical interconnections in a semiconductor device as recited in claim 1, wherein the scanning electron microscope applies a beam of electrons over a selected portion of the interconnect structure.

3. A method for inspecting electrical interconnections in a semiconductor device as recited in claim 2, wherein secondary electrons are emitted off of the upper metallization layer in response to the beam of electrons that is applied to the selected portion of the interconnect structure, the secondary electrons emitted off of the upper metallization layer define the electron intensity image.

4. A method for inspecting electrical interconnections in a semiconductor device as recited in claim 3, wherein when the inspecting of the electron intensity image is performed, a darker portion of the electron intensity image of the upper metallization layer is produced when fewer of the secondary electrons are emitted off of the upper metallization layer, and a brighter portion of the electron intensity image of the upper metallization layer is produced when more of the secondary electrons are emitted off of the upper metallization layer.

5. A method for inspecting electrical interconnections in a semiconductor device as recited in claim 4, wherein the brighter portion of the electron intensity image is associated with the upper metallization layer being substantially aligned with the lower metallization layer, and the lower metallization layer being in electrical contact with a base layer.

6. A method for inspecting electrical interconnections in a semiconductor device as recited in claim 5, wherein the base layer is one of a substrate layer and a large metallization feature.

7. A method for inspecting electrical interconnections in a semiconductor device as recited in claim 4, wherein the darker portion of the electron intensity image is associated with the upper metallization layer being misaligned with the lower metallization layer, and the upper metallization layer is not in electrical contact with a base layer.

8. A method for inspecting electrical interconnections in a semiconductor device as recited in claim 7, wherein the base layer is one of a substrate layer and a large metallization feature.

9. A method for inspecting electrical interconnections in a semiconductor device as recited in claim 2, further comprising the act of:
   tilting the interconnect structure at an angle of between about 55 degrees and about 75 degrees measured from a plane that is perpendicular to the beam of electrons that are applied to the selected portion of the interconnect structure.

10. A method for inspecting electrical interconnections in a semiconductor device as recited in claim 9, further comprising the act of:
    setting an acceleration voltage of the beam of electrons to be at most about 2 kilovolts.

11. A method for inspecting electrical interconnections in a semiconductor device as recited in claim 1, wherein the interconnect structure is a test structure.

12. A method for inspecting electrical interconnections in a semiconductor device as recited in claim 11, wherein the test structure is located along a scribe line.

13. A method for inspecting electrical interconnections in a semiconductor device as recited in claim 1, wherein a computer system is coupled to the scanning electron microscope that is set to repetitively perform the passive voltage contrast operation and the inspecting operation over a wafer.

14. A semiconductor inspection apparatus for detecting misalignments in an interconnect structure, comprising:

a chamber having an electron column and a secondary electron detector; and a stage for holding a substrate having the interconnect structure, the stage being configured to tilt the substrate, such that an electron beam that is emitted from the electron column is directed at the interconnect structure, and a plurality of secondary electrons are emitted off of the interconnect structure and detected by the secondary electron detector to ascertain a presence of a misalignment between a lower metallization feature and an upper metallization feature of the interconnect structure.

15. A semiconductor inspection apparatus for detecting misalignments in an interconnect structure as recited in claim 14, wherein the plurality of secondary electrons are emitted from a first region of the interconnect structure at a higher intensity than a second region of the interconnect structure, and the higher intensity of the first region defines an aligned interconnect structure such that the lower metallization feature is aligned with the upper metallization feature, and the second region defines a non-aligned interconnect structure such that the lower metallization feature is not aligned with the upper metallization feature.

16. A semiconductor inspection apparatus for detecting misalignments in an interconnect structure as recited in claim 15, wherein the tilt of the stage is configured to be between about 55 degrees and about 75 degrees measured from a plane that is perpendicular to the electron beam that is emitted from the electron column onto the interconnect structure.

17. A semiconductor inspection apparatus for detecting misalignments in an interconnect structure as recited in claim 15, wherein an acceleration voltage of the electron beam is selected to be at most about 2 kilovolts.

18. A system for inspecting electrical interconnections in an interconnect structure of a semiconductor device, the interconnect structure having a lower metallization layer that lies in a lower level, and an upper metallization layer that lies in an upper level, the system comprising:

means for performing a passive voltage contrast operation using a scanning electron microscope to produce an electron intensity image that is defined from the upper metallization layer in interconnect structure; and means for inspecting the electron intensity image produced by the scanning electron microscope to determine whether a misalignment between the upper metallization layer and the lower metallization layer is present in the interconnect structure.

19. A system for inspecting electrical interconnections as recited in claim 18, further comprising:

means for applying a beam of electrons through the scanning electron microscope onto a selected portion of the interconnect structure.

20. A system for inspecting electrical interconnections as recited in claim 19, wherein secondary electrons are emitted off of the upper metallization layer in response to the beam of electrons that is applied to the selected portion of the interconnect structure.

21. A system for inspecting electrical interconnections as recited in claim 20, wherein when the inspecting of the image is performed, a darker portion of the image of the upper metallization layer is produced when fewer of the secondary electrons are emitted off of the upper metallization layer, and a brighter portion of the image of the upper metallization layer is produced when more of the secondary electrons are emitted off of the upper metallization layer.

\* \* \* \* \*